US009698836B2

(12) United States Patent
Qin et al.

(10) Patent No.: US 9,698,836 B2
(45) Date of Patent: Jul. 4, 2017

(54) SYSTEMS AND METHODS FOR MITIGATION OF SELF-INTERFERENCE IN SPECTRALLY EFFICIENT FULL DUPLEX COMMUNICATIONS

(71) Applicant: Hong Kong Applied Science and Technology Research Institute Co., Ltd., Shatin, New Territories (HK)

(72) Inventors: Wen Qin, Shenzhen (CN); Yuanyuan Du, Shenzhen (CN); Jiewei Ding, Shenzhen (CN); Man Wai Kwan, Hong Kong (CN); Angus Chi Keung Mak, Hong Kong (CN); Kong Chau Tsang, Hong Kong (CN)

(73) Assignee: Hong Kong Applied Science and Technology Research Institute Co. Ltd., Shatin (HK)

( * ) Notice: Subject to any disclaimer, the term of this patent is extended or adjusted under 35 U.S.C. 154(b) by 134 days.

(21) Appl. No.: 14/665,819

(22) Filed: Mar. 23, 2015

(65) Prior Publication Data
US 2016/0285486 A1    Sep. 29, 2016

(51) Int. Cl.
*H04B 1/10* (2006.01)
*H04B 1/04* (2006.01)
(Continued)

(52) U.S. Cl.
CPC ......... *H04B 1/1027* (2013.01); *H04B 1/0475* (2013.01); *H04B 17/345* (2015.01); *H04L 5/14* (2013.01); *H04B 2001/0408* (2013.01)

(58) Field of Classification Search
None
See application file for complete search history.

(56) References Cited

U.S. PATENT DOCUMENTS 5,691,978 A    11/1997   Kenworthy
8,031,744 B2   10/2011   Radunovic et al.
(Continued)

FOREIGN PATENT DOCUMENTS

CN   103338172 A   10/2013
CN   103580720 A   2/2014

OTHER PUBLICATIONS

Timo Huusari et al., "Wideband Self-Adaptive RF Cancellation Circuit for Full-Duplex Radio: Operating Principle and Measurement," Department of Electronics and Communications Engineering, Tempere University of Technology, Finland; project #259915; 7 pages.

(Continued)

*Primary Examiner* — Mohammad Adhami
(74) *Attorney, Agent, or Firm* — Norton Rose Fulbright US LLP

(57) ABSTRACT

Systems and methods which provide mitigation of self-interference in spectrally efficient full duplex (e.g., transmit and receive using the same frequency simultaneously) communications are described. Embodiments provide an interference mitigation structure having a multi-tap vector modulator interference cancellation circuit operable to cancel time varying multipath interference in the analog RF domain. A multi-tap vector modulator interference cancellation circuit of embodiments may comprise part of a multi-stage interference cancellation circuit, such as a multi-stage interference cancellation circuit comprising a multi-tap vector modulator interference cancellation circuit and a digital residual interference cancellation circuit. A digital residual interference cancellation circuit of embodiments provides residual interference cancellation. A multi-stage interference cancellation circuit configuration of embodiments is operable to provide cancellation of strong multipath signals as well as cancellation of residual multipath signals, including (Continued)

interference in the received signal associated with circulator leakage, antenna reflection and multipath.

18 Claims, 10 Drawing Sheets

(51) Int. Cl.
 *H04B 17/345* (2015.01)
 *H04L 5/14* (2006.01)

(56) References Cited

U.S. PATENT DOCUMENTS

| | | | |
|---|---|---|---|
| 8,570,933 | B2 | 10/2013 | Lioliou et al. |
| 8,837,332 | B2 | 9/2014 | Khojastepour et al. |
| 2012/0201153 | A1 | 8/2012 | Bharadia et al. |
| 2013/0286903 | A1 | 10/2013 | Khojastepour et al. |
| 2013/0301488 | A1 | 11/2013 | Hong et al. |
| 2014/0219139 | A1 | 8/2014 | Choi et al. |
| 2015/0229461 | A1* | 8/2015 | DiFazio ............... H04L 5/14 370/280 |
| 2016/0056946 | A1* | 2/2016 | Moher ............... H04B 15/00 370/277 |
| 2016/0094332 | A1* | 3/2016 | Griffiths ............... H04B 1/109 370/278 |
| 2016/0226653 | A1* | 8/2016 | Bharadia ............... H04B 1/525 |

OTHER PUBLICATIONS

Office Action issued for Chinese Patent Application No. 201510222566.3. Dated Oct. 28, 2016, 5 pages with English Translation.

M.E. Knox, Single antenna full duplex communications using a common carrier[C]. 2012 IEEE 13th Annual Wireless and Microwave Technology Conference (WAMICON), Florida, 2012, pp. 1-6.

Lauri Anttila, et al., Cancellation of power amplifier induced nonlinear self-interference in full-duplex transceivers[C]; 2013 IEEE 47th Asilomar Conference on Signals, Systems, and Computers (ACSSC), 2013; pp. 1193-1198.

M. Omer, et al., A compensation scheme to allow full duplex operation in the presence of highly nonlinear microwave components for 4G systems[C]; 2011 IEEE MTT-S International in Microwave Symposium Digest (MTT), 2011; pp. 1-4.

* cited by examiner

SYSTEMS AND METHODS FOR MITIGATION OF SELF-INTERFERENCE IN SPECTRALLY EFFICIENT FULL DUPLEX COMMUNICATIONS

TECHNICAL FIELD

The invention relates generally to communications and, more particularly, to mitigation of self-interference in spectrally efficient full duplex communications.

BACKGROUND OF THE INVENTION

The use of communication systems in both personal and business day-to-day tasks has become nearly ubiquitous. Both wireline communications networks and wireless communications networks, including the public switched telephone network (PSTN), the Internet, cellular networks, cable transmission systems, local area networks (LANs), metropolitan area networks (MANs), and wide area networks (WANs), are pervasively deployed in modern society and facilitate communication of voice, data, multimedia, etc.

As the use of such communication systems continues to proliferate, the channels through which such communications are conducted become more and more congested. For example, spectrum utilized for wireless communications has become heavily used, leading to limited bandwidth availability for individual devices, interference, poor communication quality, etc.

Various techniques have been adopted to mitigate or avoid interference. For example, frequency division multiple access (FDMA) and time division multiple access (TDMA) techniques have been implemented to facilitate communications by a number of devices simultaneously while mitigating or avoiding interference. However, such techniques are generally not spectrally efficient, in that distinct blocks of spectrum (in frequency and/or time) are reserved for individual communications of a device, whereby those blocks of spectrum are not available for use by other devices. Further compounding the spectral inefficiency of typical communications implementations is the use of frequency division duplexing (FDD) and/or time division duplexing (TDD), whereby the spectrum is further divided such that distinct blocks of spectrum (again, in frequency and/or time) are reserved for uplink communications and other distinct blocks of the spectrum are reserved for downlink communications.

Other techniques for mitigating or avoiding interference have implemented circuitry at a receiving device for attenuating or cancelling interfering signals. For example, some prior attempts have provided active element cancellation through the use of a vector modulator, a radio frequency (RF) multi-tap structure, or nonlinear interference signal cancellation.

The use of a vector modulator for interference cancellation was first introduced by M. E. Knox in "Single antenna full duplex communications using a common carrier," 2012 IEEE 13th Annual Wireless and Microwave Technology Conference (WAMICON), Florida, 2012: 1-6, the disclosure of which is incorporated herein by reference. The vector modulator measures the power of a received signal and, utilizing a predetermined delay assumption, implements gain control to cancel interference. The use of such a vector modulator has been proposed in various subsequent documents, such as Chinese patent application number CN103580720A, wherein a vector modulator and amplifier are used to cancel a single instance of interference, and United States patent application number US2012/0201153A1, wherein variable delay in a single instance of interference is emulated in a vector modulator by controlling the attenuation of in-phase (I) and quadrature (Q) components of a signal. Such prior vector modulator interference mitigation attempts have, however, only provided for cancelling single path interference. Moreover, the only adaptive control provided by such implementations has been based solely on a receive signal strength indicator (RSSI).

The RF multi-tap structure shown in U.S. Pat. No. 5,691,978 uses multi-tap RF delay and attenuator, providing analog cancellation, with digital adaptive filtering to mitigate interference. The analog cancellation provided by this structure, however, does not provide adaptive control as the delays are predetermined (i.e., relying upon a pre-assumed channel response). Moreover, the digital cancellation does not address nonlinearities in the system, such as may be introduced by active components (e.g., power amplifier (PA)). Similar to the above structure, the RF multi-tap structure shown in US patent applications US2013/0301488A1 and US2014/0219139A1 utilizes pairs of delays and attenuators to cancel multi-path interference in the I and Q signal components. Also like the above RF multi-tap structure, this I/Q RF multi-tap structure utilizes predefined delay and attenuation and does not provide for adaptive control.

Where nonlinear interference signal cancellation has been provided the structure implemented references the signal prior to the active component (e.g., PA) which introduces the nonlinearity and relies upon a non-linier model for the active component. For example, Lauri Anttila, Dani Korpi, Ville Syrjala, Mikko Valkama, "Cancellation of power amplifier induced nonlinear self-interference in full-duplex transceivers <' 2013 IEEE 47th Asilomar Conference on Signals, Systems, and Computers (ACSSC), 2013, 1193-1198, proposes modeling the nonlinear channel (which is comprised of a nonlinear PA), the linear multi-path channel, and the RF self-interference channel. Similarly, M. Omer, R. Rimini, P. Heidmann, J. S. Kenney, "A compensation scheme to allow full duplex operation in the presence of highly nonlinear microwave components for 4G systems," 2011 IEEE MTT-S International in Microwave Symposium Digest (MTT), 2011, 1-4, proposes a digital adaptive nonlinear filter to faithfully reconstruct and cancel the PA nonlinearity. It is, however, very difficult to construct an accurate nonlinear model for each active component. Where the magnitude of the interfering signal is significant with respect to the signal of interest (e.g., the magnitude of the interfering signal is as large or larger than the magnitude of the signal of interest), a relatively small amount of modeling error will result in a significant amount of residual interference after application of the interference cancellation.

BRIEF SUMMARY OF THE INVENTION

The present invention is directed to systems and methods which provide mitigation of self-interference in spectrally efficient full duplex communications. Spectrally efficient full duplex communications operate to transmit and receive using the same frequency simultaneously, thereby providing increased spectral efficiency. For example, where the uplink and down link operating in the same frequency fully overlap in time (e.g., signal transmission and signal reception continuously overlap), such spectrally efficient full duplex communications may provide double the spectral efficiency as compared to a frequency division duplex or time division duplex implementation. However, the magnitude of the self-interfering signal present at the receive circuitry due to the simultaneous signal transmission and reception can be quite significant as compared to the magnitude of the received signal of interest (e.g., transmitted by a remote station). For example, the self-interfering signal in a spectrally efficient full duplex communications system may be of sufficient magnitude to exceed the dynamic range of an analog to digital converter (ADC) used in demodulating the signal.

Embodiments of the present invention provide an interference mitigation structure having a multi-tap vector modulator interference cancellation circuit operable to cancel time varying multipath interference in the analog RF domain. The multi-tap vector modulator interference cancellation circuit of embodiments includes a multi-tap vector modulator, a transmit signal sampling module adapted to obtain a reference signal from the output of nonlinear transmit circuitry, a receive signal sampling module adapted to obtain a reference signal from the output of a receiver front-end module, and a channel estimation module operable to provide control to the multi-tap vector modulator based upon the output of the transmit and receive signal sampling modules. A multi-tap vector modulator interference cancellation circuit of embodiments provides an analog cancellation module operable to generate a cancelling signal with adaptive control suitable for use with respect to time-varying multipath interference signal cancellation. Moreover, multi-tap vector modulator interference cancellation circuit structure of embodiments is adapted to address nonlinearities in the system, such as may be introduced in the transmit chain (e.g., PA).

A multi-tap vector modulator interference cancellation circuit of embodiments may comprise part of a multi-stage interference cancellation circuit. For example, a multi-stage interference cancellation circuit of embodiments herein may comprise a multi-tap vector modulator interference cancellation circuit and a digital residual interference cancellation circuit. The digital residual interference cancellation circuit of embodiments of the invention includes a residual channel estimation module adapted to sample a signal having interference cancelled by the multi-tap vector modulator interference cancellation circuit and a finite impulse response (FIR) module operable to provide residual interference cancellation based upon the output of the residual channel estimation module. Such a multi-stage interference cancellation circuit configuration is operable to provide cancellation of strong multipath signals as well as cancellation of residual multipath signals, including interference in the received signal associated with circulator leakage, antenna reflection and multipath.

Interference cancellation circuits implementing multi-tap vector modulator interference cancellation circuits according to the concepts herein resolve problems with respect to large self-interference exceeding the dynamic range of receiver chain components, resolve problems with respect to multi-path self-interference, resolve problems with respect to time varying delay and power level of the interference paths, as well as resolve problems with respect to self-interference signals having nonlinearities associated with active components. Accordingly, such interference cancellation circuits facilitate the implementation of spectrally efficient full duplex communications. Moreover, systems implementing interference cancellation circuits adapted to mitigate full duplex communication self-interference according to the concepts herein allow for greater flexibility in spectrum usage.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION OF THE INVENTION

Figure 1:
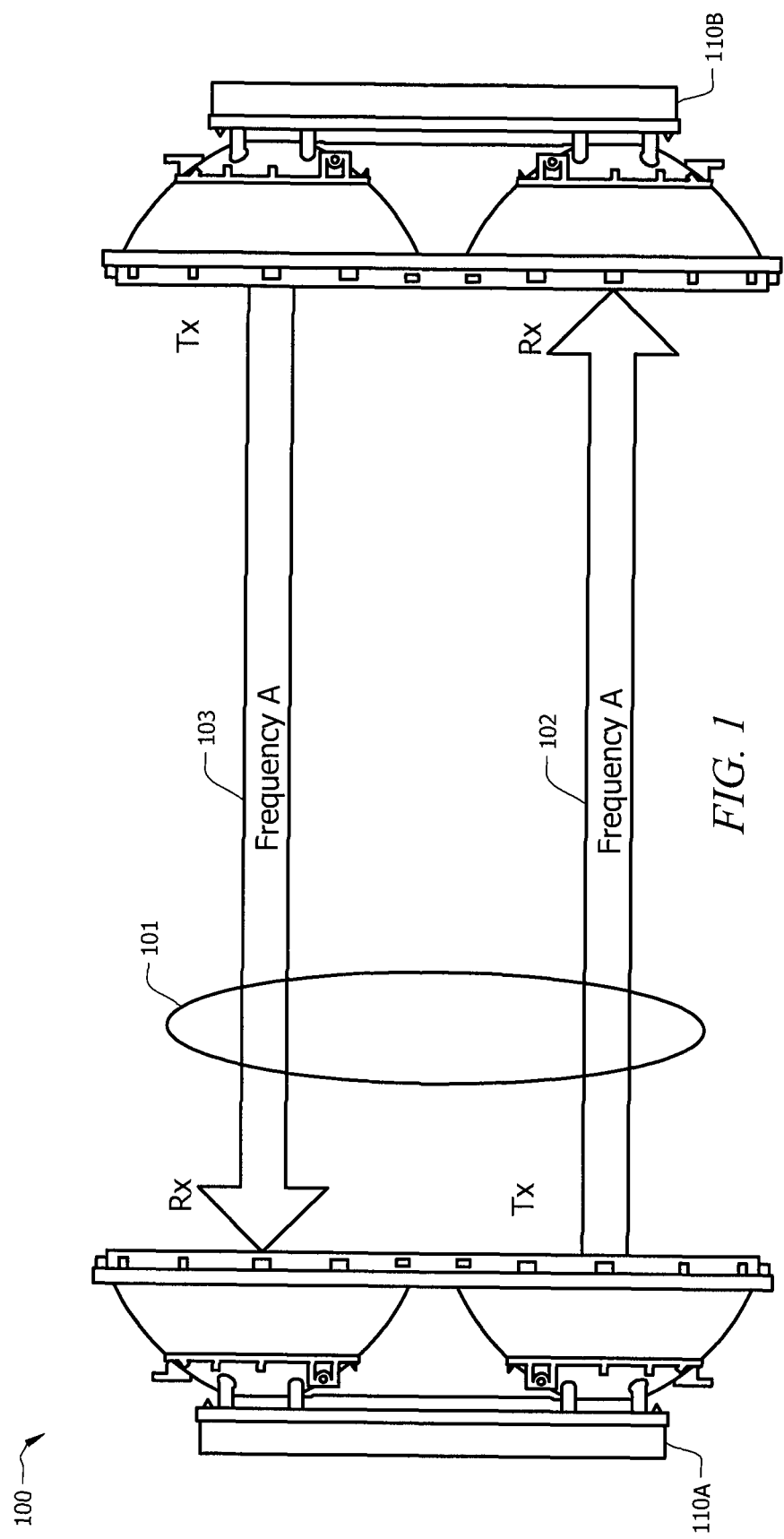
FIG. 1 shows operation of a spectrally efficient full duplex communication system in accordance with embodiments of the present invention.

FIG. 1 illustrates operation of a spectrally efficient full duplex communications system. Spectrally efficient full duplex communications system 100 of FIG. 1 includes stations 110A and 110B (only a portion of which are shown in the illustration) in data communication via wireless link 101. Stations 110A and 110B may, for example, comprise various forms of processor-based devices, such as user devices (e.g., personal computers (PCs), notebook computers, personal digital assistants (PDAs), cellular telephones, smart phones, tablet devices, workstation terminal devices, kiosk terminals, etc.), service provider devices (e.g., servers, head-end systems, back-end systems, operations, administration, maintenance, and provisioning (OAM&P) systems, etc.), and/or infrastructure devices (e.g., access points (APs), base stations (BSs), switches, routers, etc.). Wireless link 101 may be provided by a wireless communications network, such as may comprise a portion of the PSTN, the Internet, a cellular network, a cable transmission system, a LAN, a MAN, a WAN, etc.

Spectrally efficient full duplex communications system 100 operates to transmit and receive using the same frequency. For example, uplink transmission 102 and downlink transmission 103, each operating in the same frequency (e.g., represented as Frequency A), may fully overlap in time such that signal transmission and signal reception at each of stations 110A and 110B continuously overlap. It should be appreciated, however, that such transmissions provided according to embodiments may not fully overlap (e.g., partially overlap in frequency, such as through the use of partially overlapping frequency bands in the uplink and downlink, and/or partially overlap in time, such as through the use of partially overlapping uplink and downlink transmission burst periods), and may nevertheless provide some level of spectral efficiency.

The foregoing spectrally efficient full duplex communications generally result in an appreciable self-interfering signal being present at the receive circuitry of a station. For example, as shown in FIGS. 2A-2D, the magnitude of the self-interfering signal present at the receive circuitry due to the simultaneous signal transmission and reception can be quite significant as compared to the magnitude of the received signal of interest (e.g., transmitted by a remote station).

Figure 2A:
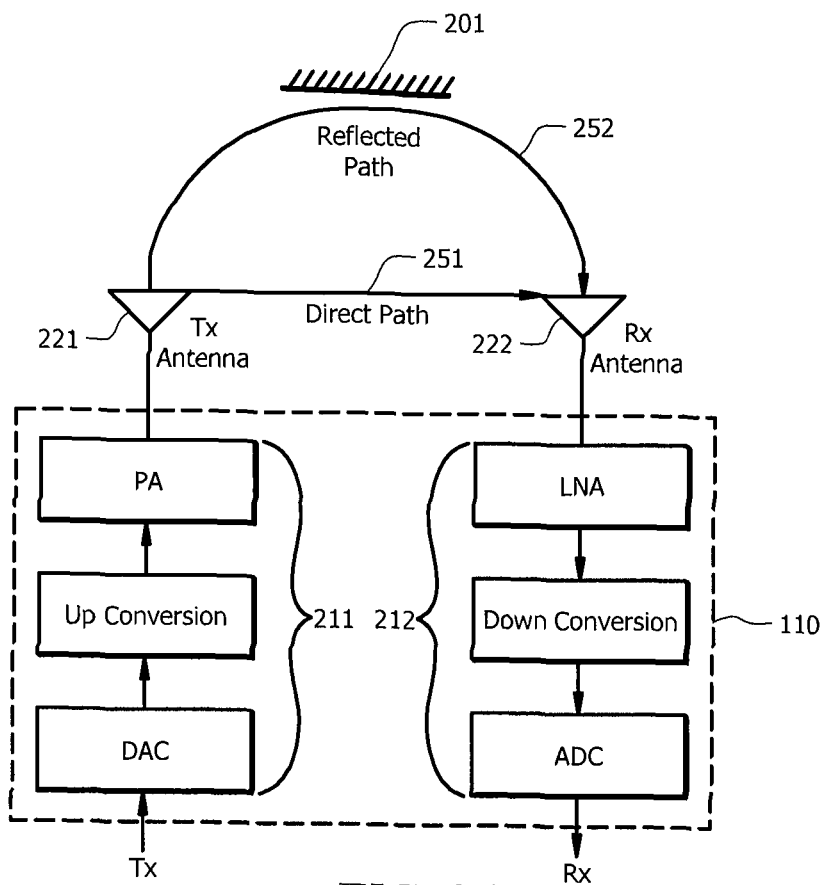
FIG. 2A shows a spectrally efficient full duplex communication station configuration in which the transmit circuitry and the receive circuitry utilize separate antenna structure.
Figure 2B:
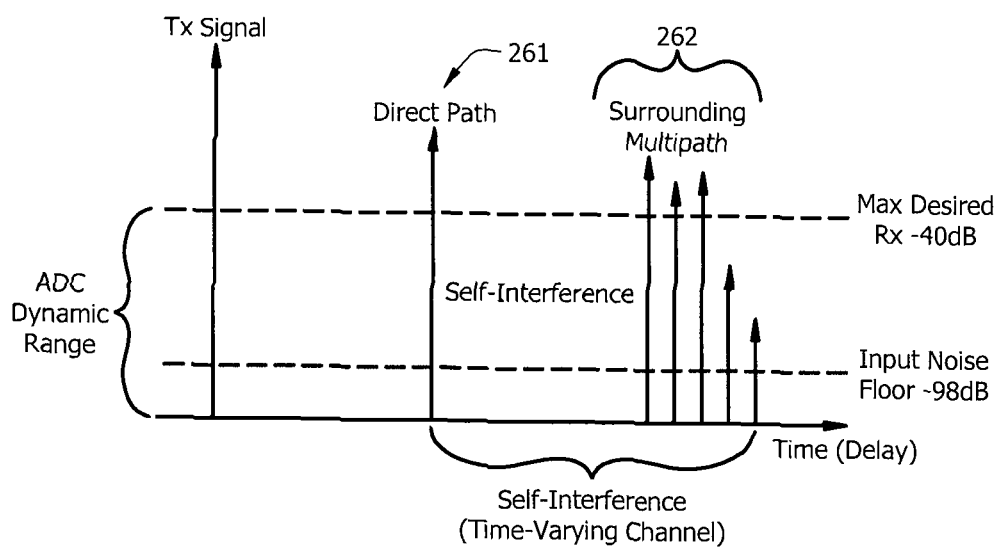
FIG. 2B shows self-interfering signals as present at the receiving circuitry of the spectrally efficient full duplex communication station of FIG. 2A.

FIG. 2A, for example, shows a configuration of station 110 (e.g., as may correspond to either of stations 110A or 110B of FIG. 1) in which the transmit circuitry (represented as transmit chain 211) and the receive circuitry (represented as receive chain 212) utilize separate antenna structure (shown as antenna elements 221 and 222), thereby providing some level of isolation (e.g., spatial separation and/or polarization diversity) with respect to the transmitted and received signals. Nevertheless, appreciable self-interference may result, such as due to direct path 251 between antenna elements 221 and 222 and/or reflected path 252 associated with environmental feature 201 (e.g., walls, ceilings, buildings, mountains, etc.). As shown in FIG. 2B, the magnitude of the self-interfering signals as present at the receiving circuitry can be quite substantial, particularly as compared to the magnitude of the transmitted signal and the magnitude of a received signal of interest. For example, the magnitude of a self-interfering signal (represented by vector 261) resulting from direct path 251 may exceed a maximum desired receive power (e.g., exceeding the operational range of one or more portion of the receive circuitry, such as exceeding the dynamic range of the receive chain ADC). Likewise, the magnitude of a self-interfering signal (multipath instances of which are represented by vectors 262) resulting from reflected path 252 may exceed the maximum desired receive power.

Figure 2C:
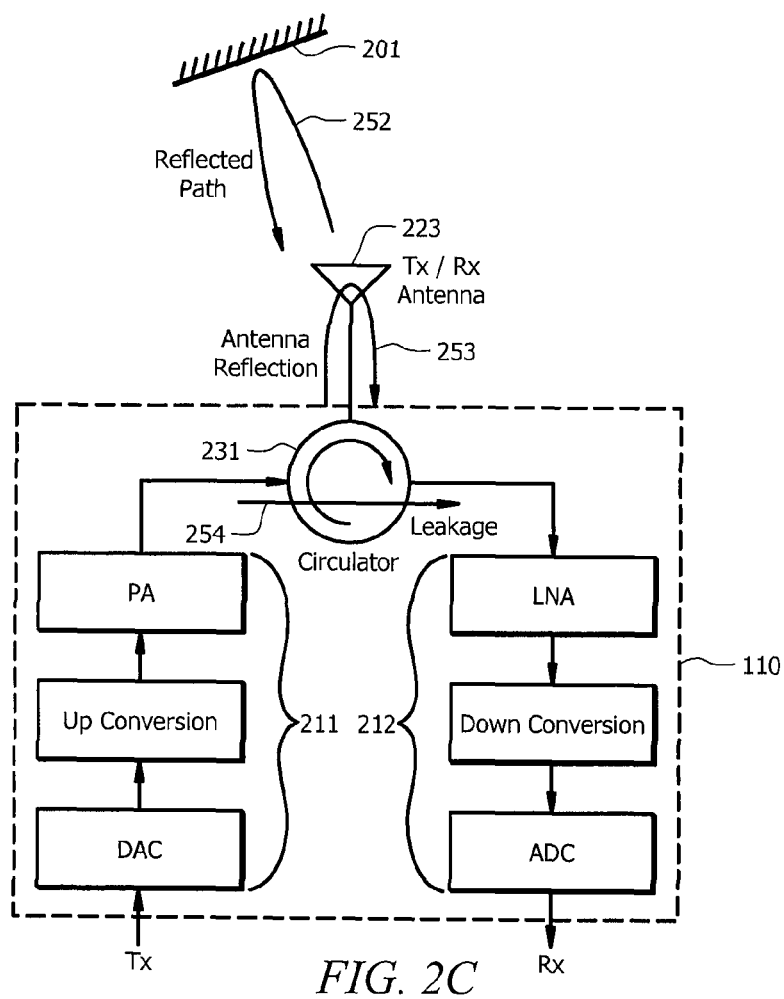
FIG. 2C shows a spectrally efficient full duplex communication station configuration in which the transmit circuitry and the receive circuitry utilize a common antenna structure.
Figure 2D:
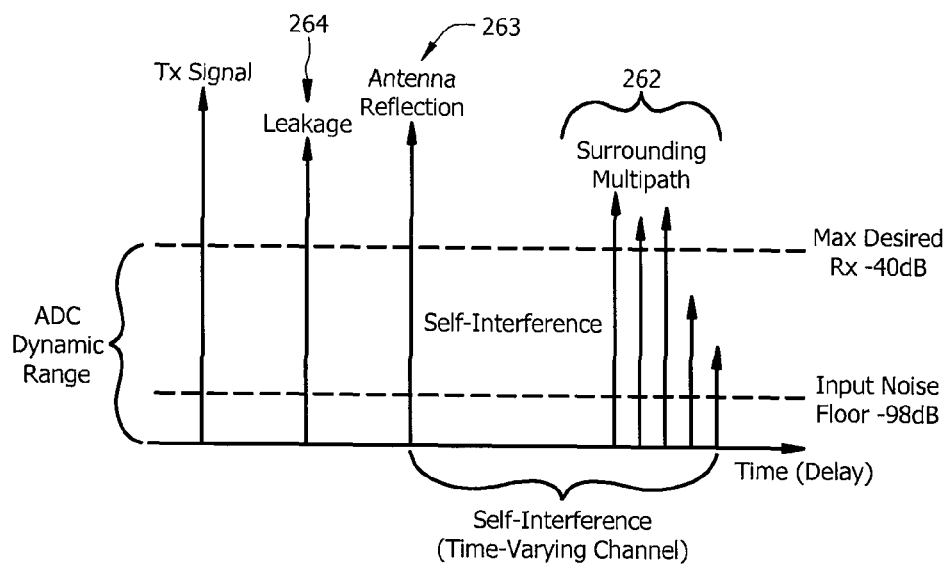
FIG. 2D shows self-interfering signals as present at the receiving circuitry of the spectrally efficient full duplex communication station of FIG. 2C.

As another example, FIG. 2C, for example, shows a configuration of station 110 in which the transmit circuitry and the receive circuitry utilize a common antenna structure (shown as antenna element 223), whereby circulator circuitry (shown as circulator 231) provides some level of isolation (e.g., port isolation) with respect to the transmitted and received signals. As in the previous example, appreciable self-interference may nevertheless result, such as due to reflected path 252 associated with environmental feature 201, antenna reflection path 253 (e.g., transmission circuitry and antenna system impedance mismatch, impedance mismatch at the antenna air interface, etc.), and/or leakage path 254 (e.g., leakage between circulator ports). As shown in FIG. 2D, the magnitude of the self-interfering signals as present at the receiving circuitry can again be quite substantial. For example, the magnitude of a self-interfering signal (represented by vector 264) resulting from leakage path 254 may exceed the maximum desired receive power. Likewise, the magnitude of a self-interfering signal (represented as vector 263) resulting from antenna reflection path 253 may exceed the maximum desired receive power. Similarly, the magnitude of a self-interfering signal (multipath instances of which are again represented by vectors 262) resulting from reflected path 252 may exceed the maximum desired receive power.

It can readily be appreciated from the foregoing that the magnitude of the self-interfering signals present at the receive circuitry due to the simultaneous signal transmission and reception of spectrally efficient full duplex communications system 100 can be significant. Moreover, these self-interfering signals may be time varying, such as due to changes in the multipath environment.

Embodiments of the present invention provide an interference mitigation structure having a multi-tap vector modulator interference cancellation circuit operable to cancel time varying multipath interference in the analog RF domain. For example, multi-tap vector modulator interference cancellation circuit 310 is shown in the embodiment of station 110 shown in FIG. 3A. It should be appreciated that station 110 represented in FIG. 3A may comprise various configurations, such as a configuration in which the transmit circuitry and the receive circuitry utilize separate antenna structure (as shown in FIG. 2A), a configuration in which the transmit circuitry and the receive circuitry utilize a common antenna structure via a circulator (as shown in FIG. 2C), etc.

Figure 3A:
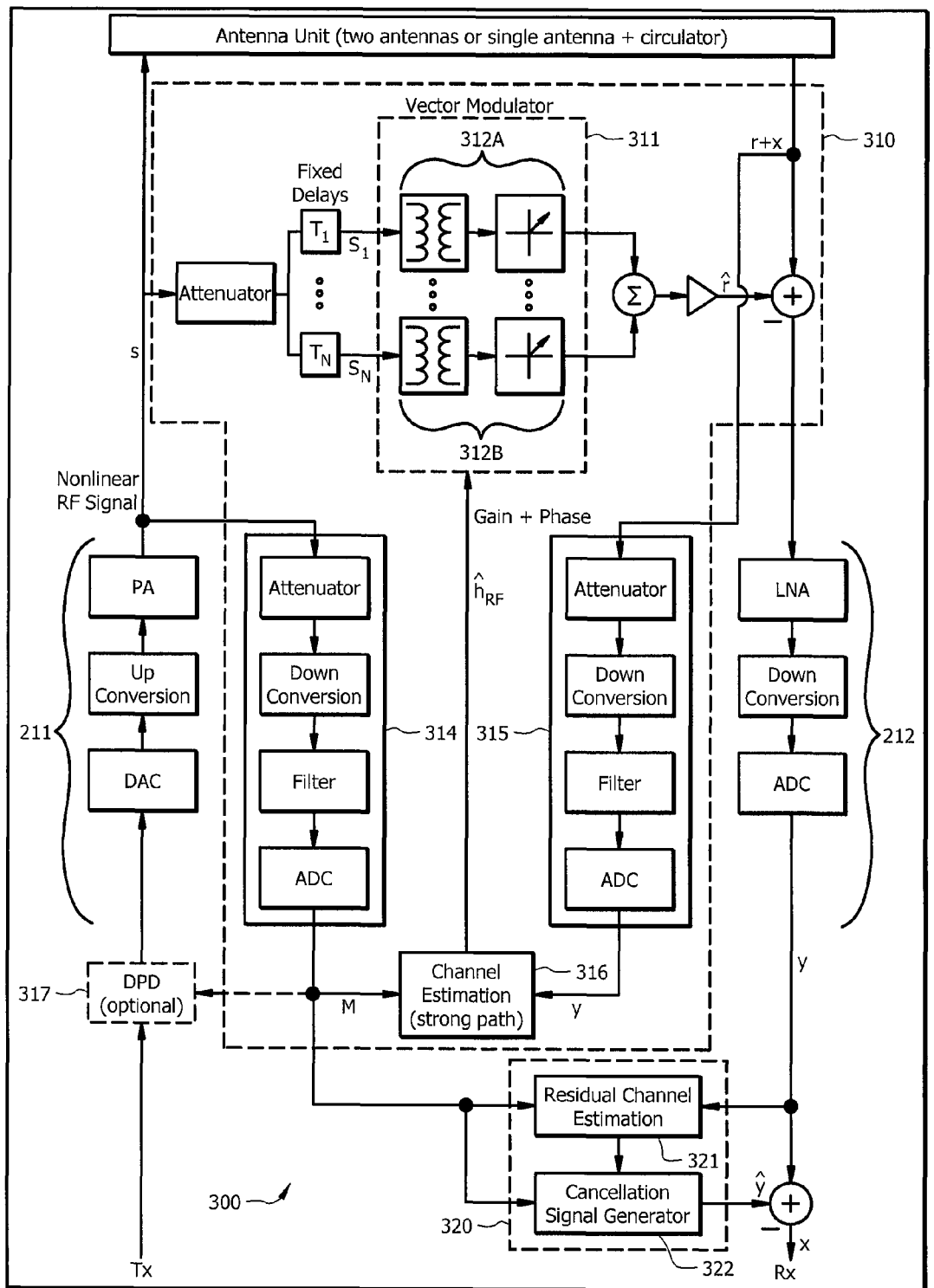
FIG. 3A shows a multi-stage interference cancellation circuit in accordance with embodiments of the present invention.
Figure 3B:
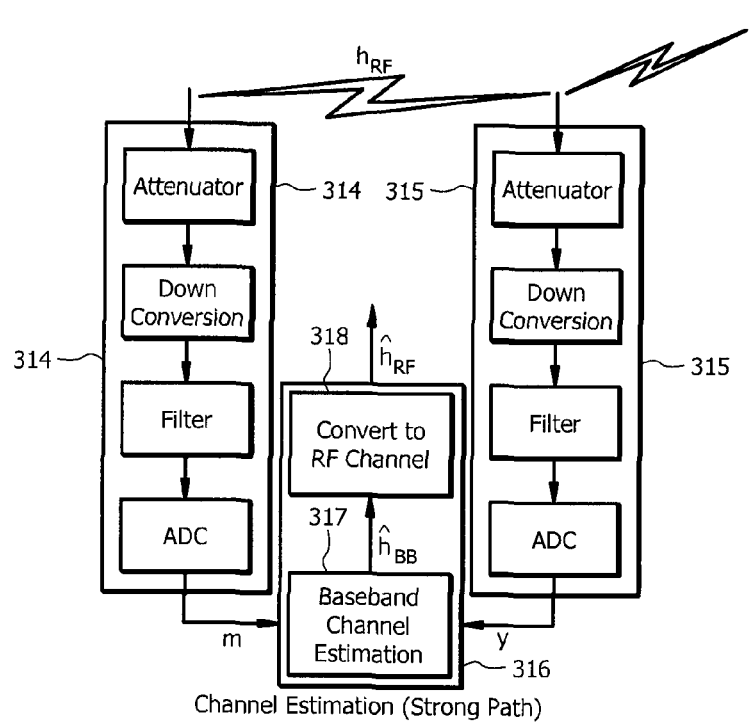
FIG. 3B shows detail with respect to a channel estimation module of the multi-stage interference cancellation circuit of FIG. 3A in accordance with embodiments of the invention.
Figure 3C:
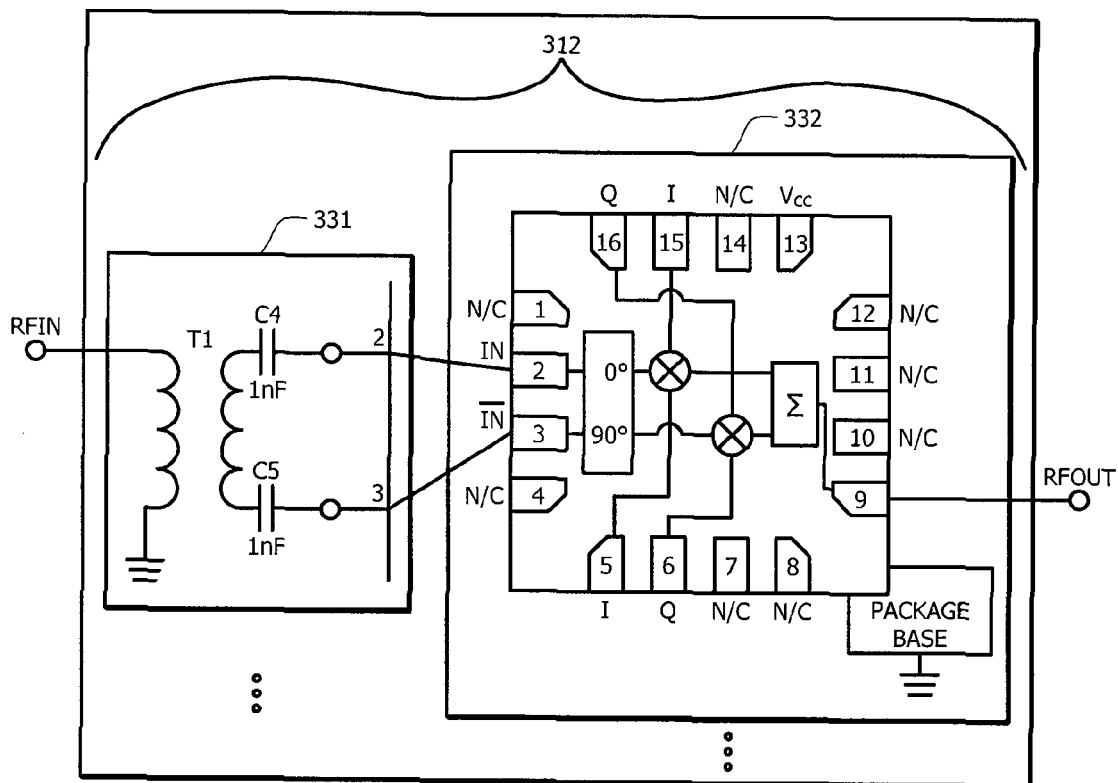
FIG. 3C shows detail with respect to one-tap of a multi-tap vector modulator module of the multi-stage interference cancellation circuit of FIG. 3A in accordance with embodiments of the invention.

The embodiment of multi-tap vector modulator interference cancellation circuit 310 illustrated in FIG. 3A includes multi-tap vector modulator 311, transmit signal sampling module 314, receive signal sampling module 315, and channel estimation module 316 operable in cooperation to provide active analog cancellation, such as to mitigate strong multipath self-interference signals. Additional detail with respect to embodiments of channel estimation module 316 and one tap of multi-tap vector modulator 311 are shown in FIGS. 3B and 3C, respectively.

As shown in FIG. 3A, transmit signal sampling module 314 of the illustrated embodiment is adapted to obtain a reference signal from the output of nonlinear transmit circuitry (e.g., the PA) of transmit chain 211, thereby sampling any nonlinearities introduced into the transmit signal by such transmit circuitry. Receive signal sampling module 315 of the illustrated embodiment is adapted to obtain a reference signal from the output of the antenna feed structure of the front-end circuitry. In operation, the illustrated embodiment of channel estimation module 316 provides a control to multi-tap vector modulator 311 based upon the output of transmit signal sampling module 314 and receive signal sampling module 315.

A configuration of a receive signal sampling module coupled in the receive chain prior to certain nonlinear receive components (e.g., the LNA and/or other nonlinear receive circuitry), as with receive signal sampling module 315 of the illustrated embodiment, may be desirable where, for example, multiple stages of interference cancellation are provided which mitigate the nonlinearities introduced by the aforementioned receive circuitry. For example, the analog cancellation point of the embodiment illustrated in FIG. 3A is located before the LNA, and thus the reference signal for the analog cancellation is correspondingly taken before the LNA. Although the LNA non-linearities will not affect the analog cancellation, the multi-stage interference cancellation configuration shown provides a further interference cancellation stage (shown as digital residual interference cancellation circuit 320) wherein the cancellation point is after the receive chain including the LNA. The received signal in the digital cancellation point suffers from the non-linearities of the LNA, and thus the digital residual channel estimation uses the signal after the LNA as the reference signal, allowing the digital cancellation algorithm to adapt to the LNA non-linearities (as will be better understood from the discussion of the multi-stage interference configuration of FIG. 3A which follows). Nevertheless, in some embodiments, receive signal sampling module 315 may be adapted to obtain a reference signal from the output of a receiver front-end module (e.g., as may include a portion of receive chain 212), to thereby sample any nonlinearities introduced into the receive signal by such receive circuitry.

Channel estimation module 316 of embodiments is adapted to provide a RF strong channel estimation based on the baseband signal and to convert the baseband channel estimation to RF channel parameters for use by multi-tap vector modulator 311. In operation according to embodiments, channel estimation module 316 may operate to calculate a correlation between the signals sampled by transmit signal sampling module 314 and receive signal sampling module 315, interpolating using a sinc function, and calculating a plurality of delay relationships (e.g., the plurality comprising a number of delay relationships corresponding to the number of vector modulator paths in vector modulator module 311).

As shown in FIG. 3B, channel estimation module 316 may comprise baseband channel estimation module 317 and RF channel conversion module 318. The baseband receiving signal can be expressed as $y=Mh_{BB}+x+n$, wherein y is the baseband receiving signal ($y=[y_0\ y_1\ y_{F-1}]^T$) is the circulant baseband transmit sequence matrix $$\left(M = \begin{bmatrix} m_L & \cdots & m_1 & m_0 \\ m_{L+1} & \cdots & m_2 & m_1 \\ \vdots & & \vdots & \\ m_{L+P-1} & \cdots & m_P & m_{P-1} \end{bmatrix}\right),$$

$h_{BB}$ is the complex baseband channel impulse response ($h_{BB}=[h_0\ h_1\ \ldots\ h_L]^T$), x is the desired receive signal, and n is the received signal noise component. Baseband channel estimation module 317 may operate to find the least square channel estimates by minimizing the squared error quantity $\hat{h}_{BB}=\arg_{h_{BB}}\min\|y-Mh_{BB}\|^2$ to provide $\hat{h}_{BB}=(M^H M)^{-1}M^H y$ which may be further simplified to $$\hat{h}_{BB} = \frac{1}{P}M^h y.$$

RF channel conversion module 318 may convert the estimated baseband channel to RF channel parameters according to the following, $\hat{h}_{RF,k}=\hat{h}_{BB,k}\exp(j2\pi k F_C/F_S)$ $k\in[0, L]$, where $F_C$ is the carrier frequency and $F_S$ is the sampling frequency. This estimated self-interference RF channel, $\hat{h}_{RF}$, provided by RF channel estimation module 316 is provided to multi-tap vector modulator 311 for adaptively generating an interference cancelling signal. For example, RF channel conversion module 318 of embodiments is operable to utilize the estimated channel response to generate a plurality of path in-phase and quadrature coefficients (e.g., a number of path I and Q coefficients equal to the vector modulator paths provided in vector modulator module 311), convert the plurality of path in-phase and quadrature coefficients from the digital domain to the analog domain, and filter the in-phase and quadrature coefficient changes.

Multi-tap vector modulator 311 of embodiments is adapted to provide RF strong self-interference reconstruction, with respect to multiple instances of strong self-interference within the received signal, using estimated self-interference RF channel parameters as provided by channel estimation module 316. In operation according to embodiments, multi-tap vector modulator 311 is provided multiple samples of the transmitted signal for use in reconstructing multiple instances of self-interference, such as may be associated with various interference paths (e.g., direct path, reflected path, leakage path, etc.) and/or the result of a multipath environment. Accordingly, multiple instances of the sampled transmit signal may be processed by multi-tap vector modulator 311 to generate a self-interference cancelling signal, and thus embodiments of the multi-tap vector modulator include a plurality of signal processing paths (represented as signal processing paths 312a and 312b), each preferably being responsive to an estimated self-interference RF channel signal input. For example, a transmit signal, S, sample may be split and provided to multi-tap vector modulator 311, where the transmitted signal vector S may be represented as $S=[S_0\ S_1\ \ldots\ S_{n-1}]^T$. The instances of the sampled transmit signal may be provided to multi-tap vector modulator 311 through an array of signal delay devices (e.g., using fixed delay lines, such as printed circuit board delay lines, providing an increasing delay with respect to each instance of the sampled transmit signal), as shown in the embodiment illustrated in FIG. 3A. In accordance with embodiments of the invention, the number of taps for a particular multi-tap vector modulator may be based on the sampling frequency and the greatest distance of reflected path. The range of delays implemented with respect to such a multi-tap vector modulator may be based on the greatest distance of reflected path, and the delay increment may be based on the sampling interval. As a specific example, assume a sampling frequency of 122.88 MHz and a greatest distance of reflected path of approximately 20 m, whereby the number of taps for an embodiment of a multi-tap vector modulator of an embodiment herein by be determined as: The number of taps=20*122.88e6/3e8=8 (3e8 m/s being the speed of light).

Referring now to FIG. 3C, an embodiment of a signal processing path of multi-tap vector modulator 311 is shown in further detail. The illustrated embodiment of signal processing path 312 (as may correspond to signal processing paths 312a and/or 312b of FIG. 3A) includes transformer circuit 331 and vector modulator 332. The RF cancellation signal provided by multi-tap vector modulator 311 may be expressed as $\hat{r}=S^H \hat{h}_{RF}+n$, where $\hat{r}$ is the RF cancellation signal, S is the transmitted signal vector (S=$[S_0\ S_1\ \cdots\ S_{n-1}])^T$), $\hat{h}_{RF}$ is the estimated self-interference RF channel, and n is the received signal noise component. After application of transformer circuit 321, the transmitted signal vector, S, becomes a complex vector. Thus, transformer circuit 321 of embodiments provides a 0° and 90° phase shifter adapted to provide in-phase and quadrature signal components. Vector modulator 332 of embodiments provides mixers to mix the in-phase and quadrature components of the transmitted signal with in-phase and quadrature control inputs of the RF channel parameters. A combiner of vector modulator 332 of embodiments combines the mixed in-phase and quadrature components to provide the RF cancellation signal. Accordingly, the estimated self-interference RF channel, $\hat{h}_{RF}$, is preferably provided as the estimated complex RF channel impulse response, as may be represented as $\hat{h}_{RF,k}=Ge^{j\theta}$, wherein G is gain and θ is phase. Accordingly, the estimated self-interference RF channel is converted to an analog signal prior to inputting into vector modulator 332. The analog signal for estimated self-interference RF channel may be represented by, $$I(G, \theta) = Vmi + 1.0\ V\frac{G}{G\max}\cos(\theta)$$

$$Q(G, \theta) = Vmq + 1.0\ V\frac{G}{G\max}\sin(\theta)$$

where Vmi and Vmq are the I and Q voltage settings.

As can be appreciated from the foregoing, in operation according to embodiments herein, multi-tap vector modulator interference cancellation circuit 310 provides an analog cancellation module operable to generate a RF cancellation signal, $\hat{r}$, with adaptive control suitable for use with respect to time-varying multipath interference signal cancellation. Moreover, configurations of multi-tap vector modulator interference cancellation circuit 310 are adapted to address nonlinearities in the system, such as may be introduced in the transmit chain (e.g., PA).

Referring again to FIG. 3A, digital pre-distortion (DPD) module 317 is shown as an optional functional block disposed in the transmit signal path according to embodiments herein. DPD module 317 of the illustrated embodiment is coupled to transmit signal sampling module 314 to receive sampled transmit signals therefrom. As discussed above, transmit signal sampling module 314 is adapted to obtain samples of the transmit signal from the output of nonlinear transmit circuitry (e.g., the PA) of transmit chain 211, and thus may include the effects of nonlinear distortion. DPD module 317 of embodiments is operable to generate pre-distorted signals using the output of transmit signal sampling module 314 to thereby mitigate the effects of the nonlinear transmit circuitry in the signal ultimately transmitted. For example, the use of such pre-distortion may suppress the non-linear distortion of the transmitted signal, and indirectly reduce the impact of non-linear component in self-interference signal. It should be appreciated that the sampled signal provided by transmit signal sampling module 314 can be a good reference for DPD module 317 to adapt the nonlinearity in the PA output, thereby further leveraging the use of sampling circuitry provided according to embodiments herein.

Multi-tap vector modulator interference cancellation circuit 310 of the embodiment illustrated in FIG. 3A comprises part of a multi-stage interference cancellation circuit. In particular, multi-stage interference cancellation circuit 300 of FIG. 3A comprises multi-tap vector modulator interference cancellation circuit 310 and digital residual interference cancellation circuit 320.

Figure 3D:
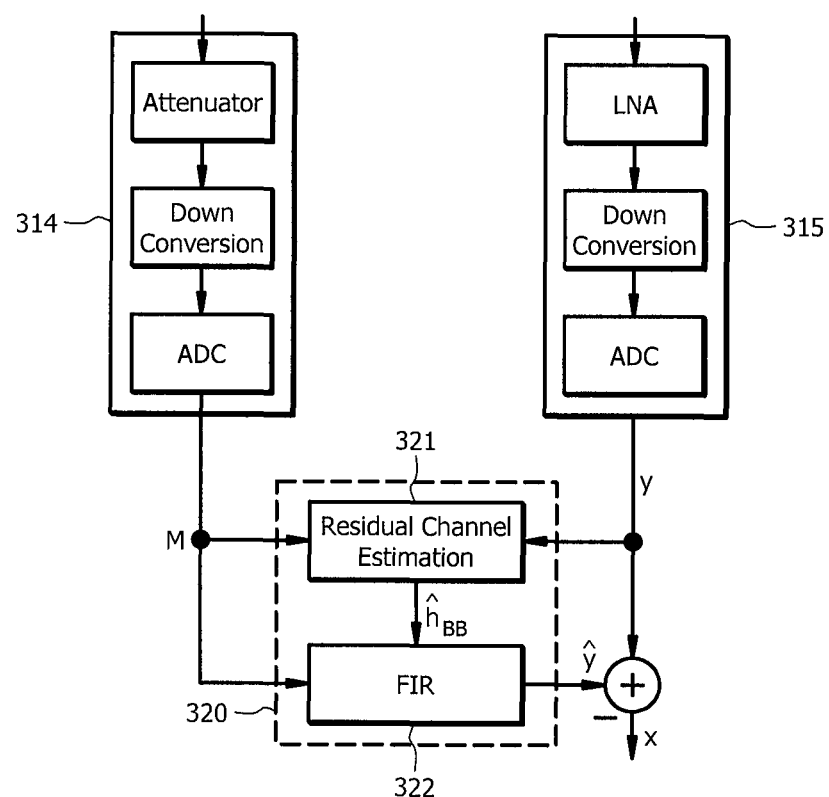
FIG. 3D shows detail with respect to a residual interference cancellation module of the multi-stage interference cancellation circuit of FIG. 3A in accordance with embodiments of the invention.

Digital residual interference cancellation circuit 320 of embodiments provides residual channel estimation and self-interference cancellation based on the baseband signal. Accordingly, as shown in FIG. 3A, digital residual interference cancellation circuit 320 may comprise residual channel estimation module 321 and cancellation signal generator module 322. Residual channel estimation module 321 of embodiments is adapted to sample a signal having interference cancelled by multi-tap vector modulator interference cancellation circuit 310 and provide a signal representing the complex baseband channel impulse response with respect to the residual channel (i.e., the channel including residual self-interference after cancellation provided by operation of multi-tap vector modulator interference cancellation circuit 310, including errors, nonlinearities, etc. remaining or introduced thereby). Cancellation signal generator module 322 of embodiments, such as may comprise a finite impulse response (FIR) module configuration as shown in FIG. 3D, is operable to provide residual interference cancellation based upon the output of the residual channel estimation module. Such a multi-stage interference cancellation circuit configuration is operable to provide cancellation of strong multipath signals as well as cancellation of residual multipath signals, including interference in the received signal associated with circulator leakage, antenna reflection and multipath.

Residual channel estimation module 321 of embodiments operates to provide residual channel estimation based on a baseband signal. Residual channel estimation module 321 of embodiments may, for example, operate to provide correlation channel estimation based on all known transmit signals, correlation channel estimation based on one or more known training sequences, frequency domain channel estimation based on one or more pilot, and/or adaptive filtering based on least means squared (LMS) or recursive least squares (RLS).

The residual baseband received signal may be expressed as $y = Mh_{BB}+x+n$, wherein y is the baseband receiving signal ($y=[y_0\ y_1\ \cdots\ y_{F-1}]^T$), M is the circulant baseband transmit sequence matrix $$\left( M = \begin{bmatrix} m_L & \cdots & m_1 & m_0 \\ m_{L+1} & \cdots & m_2 & m_1 \\ \vdots & & \vdots & \vdots \\ m_{L+P-1} & \cdots & m_P & m_{P-1} \end{bmatrix} \right),$$

$h_{BB}$ is the complex baseband channel impulse response ($h_{BB}=[h_0\ h_1\ \ldots\ h_L]^T$), x is the desired receive signal, and n is the received signal noise component. Residual channel estimation module 321 may operate to find the least square channel estimates by minimizing the squared error quantity $\hat{h}_{BB} = {}_{h_{BB}}^{arg} \min \|oy - Mh_{BB}\|^2$ to provide $\hat{h}_{BB} = (M^H M)^{-1} M^H y$. In operation according to the embodiment illustrated in FIG. 3D, a digital baseband cancellation signal is reconstructed based upon a finite impulse response model. This digital cancellation signal can be expressed as $\hat{y} = M\hat{h}_{BB}$. Digital cancellation provided using the digital cancellation signal can be expressed as $x = y - \hat{y}$.

Figure 4:
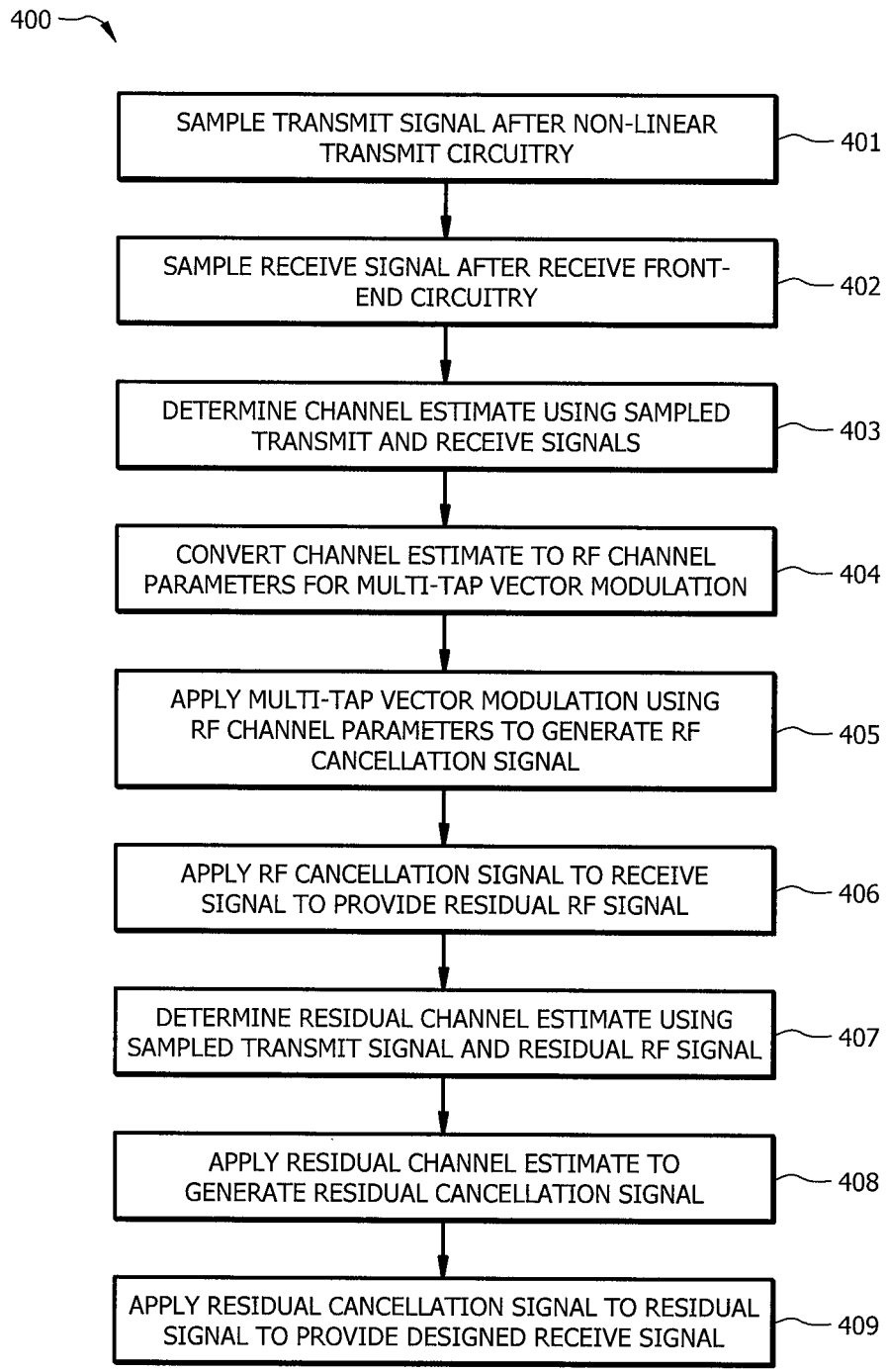
FIG. 4 shows a high level flow diagram of operation of a multi-stage interference cancellation circuit in accordance with embodiments of the present invention.

FIG. 4 shows a high level flow diagram of operation to provide interference mitigation using a multi-stage interference cancellation circuit, including a multi-tap vector modulator interference cancellation circuit and a digital residual interference cancellation circuit, to cancel time varying multipath interference in accordance with operation of embodiments represented in FIG. 3A. In particular, flow 400 of FIG. 4 provides for operation in both the analog and digital domains cooperative to cancel time varying multipath self-interference.

At block 401 of the illustrated embodiment, a transmit signal is sampled after processing of the transmit signal by nonlinear (e.g., active) transmit circuitry. For example, the transmit signal may be sampled after amplification by a transmit PA (e.g., after the PA of transmit chain 211), as described above. Accordingly, the sampled transmit signal preferably includes non-linearities introduced in the transmit chain.

At block 402, the illustrated embodiment of flow 400 samples the receive signal after receive front-end circuitry. For example, the receive signal may be sampled at an output of the antenna feed structure of the front-end circuitry. In operation according to embodiments, the receive signal may be sampled at a point in the receive chain after nonlinear circuitry (e.g., after the LNA of receive chain 212 and/or other active receive circuitry), to thereby sample any non-linearities introduced into the receive signal by such receive circuitry.

A channel estimate is determined (e.g., by baseband channel estimation module 317) using the sampled transmit and receive signals at block 403 of the illustrated embodiment. The channel estimate is preferably converted to RF channel parameters (e.g., by RF channel conversion module 318) for use in multi-tap vector modulation according to the concepts herein at block 404. Thus, at block 405 of the embodiment of flow 400 illustrated in FIG. 4 multi-tap vector modulation is applied (e.g., by multi-tap vector modulator 311), using the RF channel parameters, to generate an RF cancellation signal. The RF cancellation signal is applied to the receive signal (e.g., by subtracting the RF cancellation signal from the receive signal) to provide a residual RF signal at block 406 of the illustrated embodiment.

Figure 5A:
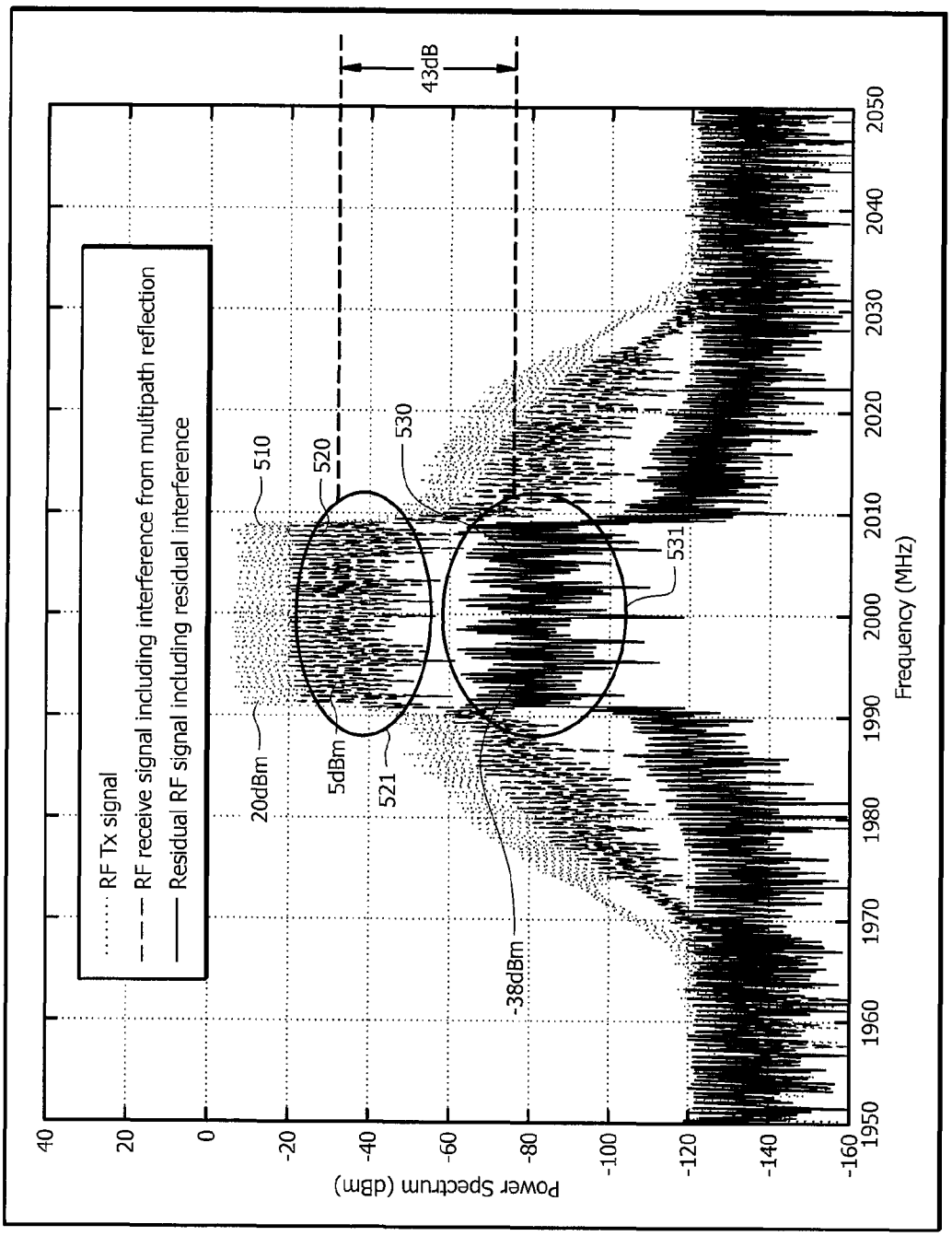
FIG. 5A shows simulation results of operation of an analog self-interference cancellation stage of a multi-stage interference cancellation circuit according to embodiments of the present invention.

FIG. 5A shows simulation results of analog strong multipath self-interference cancellation in accordance with the foregoing operation of the analog stage of the exemplary multi-stage interference cancellation circuit. In the simulation of FIG. 5A, the station is assumed to utilize a single antenna and circulator structure, wherein the transmit power is 20 dBm (e.g., an LTE signal with a bandwidth of 20 MHz) and 10-tap RF cancellation is utilized in the multi-tap vector modulator. In the illustration of FIG. 5A, graph line 510 represents the transmit signal, graph line 520 represents the receive signal, and graph line 530 represents the residual RF signal. As can be seen in graph line 520, the receive signal includes strong self-interference (represented by interference 521), such as may result from a leakage path, antenna reflection, multipath, etc. However, after application of analog strong multipath self-interference cancellation according to concepts herein, the residual RF signal, as shown by graph line 530, approximately 43 dB of cancellation has been provided, resulting in a residual RF signal having a level of residual interference (represented by interference 531) that can be further processed by the digital stage of the exemplary multi-stage interference cancellation circuit.

At block 407 of flow 400 illustrated in FIG. 4 a residual channel estimate is determined (e.g., by residual channel estimation module 321) using the sampled transmit signal and the residual RF signal. In operation according to embodiments, the residual channel estimate is applied to a cancellation signal generator (e.g., cancellation signal generator module 322), such as may comprise a FIR module, to generate a residual cancellation signal, as shown at block 408. The residual cancellation signal is applied to the residual RF signal (e.g., by subtracting the residual RF cancellation signal from the residual RF signal in the digital domain) to provide a desired signal (e.g., a receive signal having strong self-interference from multiple paths substantially cancelled, or otherwise mitigated, therefrom).

Figure 5B:
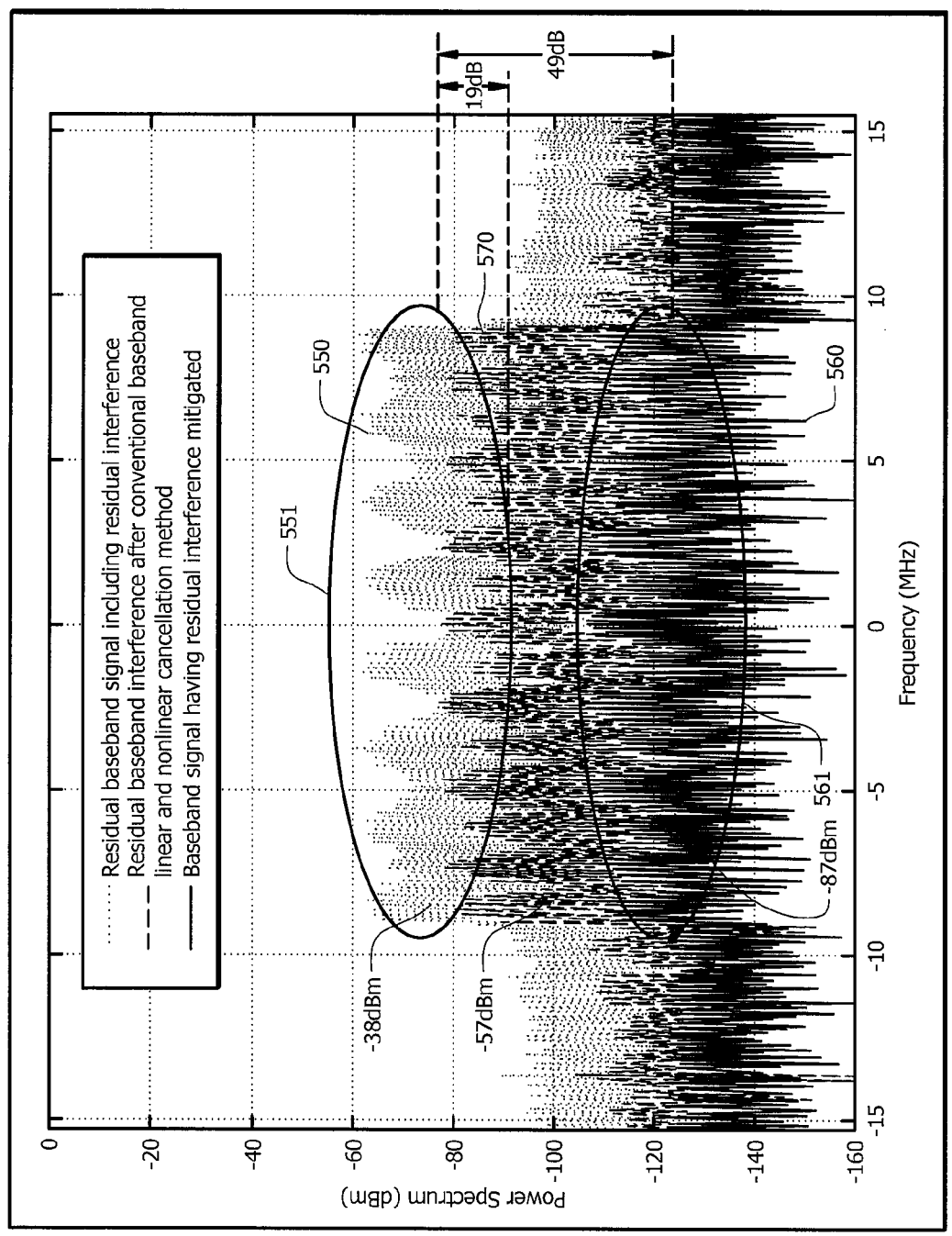
FIG. 5B shows simulation results of operation of a digital self-interference cancellation stage of a multi-stage interference cancellation circuit according to embodiments of the present invention.

FIG. 5B shows simulation results of digital multipath self-interference cancellation in accordance with the foregoing operation of the digital stage of the exemplary multi-stage interference cancellation circuit. In the simulation of FIG. 5B, it is assumed that the desired receive signal is −40 dBm, wherein this desired receive signal is mixed with residual interference (e.g., the residual baseband signal seen in graph line 530 having residual interference represented by interference 551). It should be appreciated that the residual interference affects estimating coefficients of the nonlinear model. Accordingly, the exemplary embodiment implements residual channel estimation, as described above. Application of digital multipath self-interference cancellation in the simulation, wherein the nonlinear transmit chain output is sampled to provide nonlinear cancellation and linear cancellation simplified together as linear interference cancellation, results in 49 dB of interference cancellation (e.g., the desired receive signal is provided as a baseband signal having interference substantially cancelled, or otherwise mitigated, therefrom by 49 dB as represented by interference 561).

For comparison, graph line 570 illustrates operation of conventional nonlinear cancellation techniques. In conventional techniques, digital cancellation would need to cancel linear components and nonlinear components respectively, whereby the cancellation of these components would affect one another. Because of the imprecise nonlinear model (e.g., the nonlinearities of active components such as a PA and/or LNA generally cannot be modeled with complete accuracy), the conventional nonlinear cancellation cannot completely eliminate the nonlinear interference. Where the magnitude of the interfering signal is large as compared to the desired receive signal magnitude (e.g., the self-interference resulting from operation of a spectrally efficient full duplex communication system, as described herein), such inaccuracies in the nonlinear model result in the cancellation provided not being sufficiently accurate to satisfactorily mitigate the interference. The result, as shown in the simulation results, is that this conventional interference cancellation achieves only 19 dB cancellation performance. Accordingly, the remaining nonlinear components are higher than the noise floor (assumed to be −98 dBm in the foregoing simulations).

It should be appreciated that various of the foregoing functions, modules, and/or processes, or portions thereof, may be implemented as one or more instruction set operable upon processor-based systems. For example, embodiments of the aforementioned channel estimation module and/or digital residual interference cancellation circuit may comprise instruction sets executable upon a processor of a communication station (e.g., a user device, network infrastructure, etc.). When implemented in software, elements of the present invention may comprise the code segments to perform tasks as described herein. The program or code segments can be stored in a processor readable (e.g., computer readable) medium. The "processor readable medium" may include any non-transitory medium that can store information. Examples of the processor readable medium include an electronic circuit, a semiconductor memory device, random access memory (RAM), a read only memory (ROM), a flash memory, an erasable ROM (EROM), a magnetic disk memory, an optical disk memory, etc.

Figure 6:
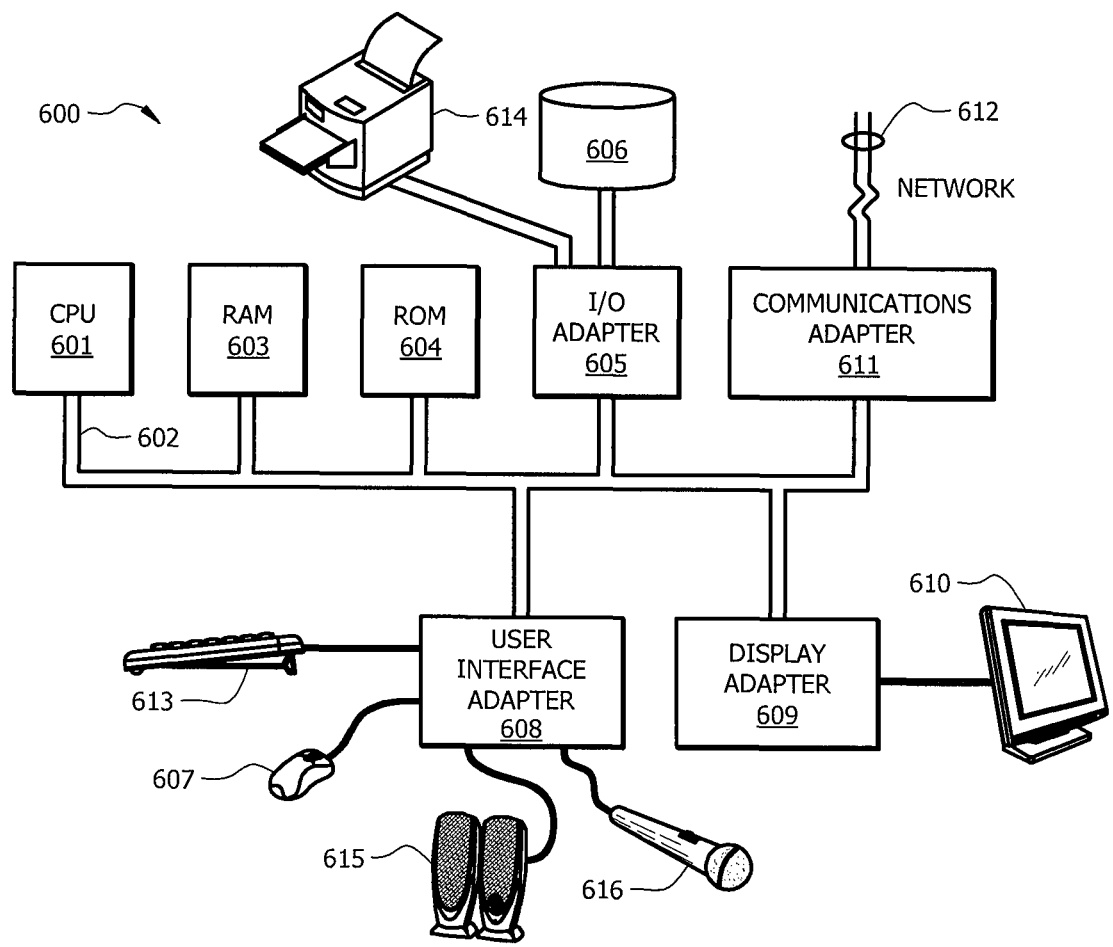
FIG. 6 shows a processor-based system configuration as may be utilized in providing self-interference cancellation according to embodiments of the present invention.

FIG. 6 illustrates a portion of processor-based system 600, such as may correspond to an embodiment of station 110 described above, adapted to provide self-interference cancellation according to concepts as described herein. In the illustrated embodiment of processor-based system 600, central processing unit (CPU) 601 is coupled to system bus 602. CPU 601 may be any general purpose CPU, such as a PENTIUM or CORE processor available from Intel Corporation. The present invention is not restricted by the architecture of CPU 601 as long as CPU 601 supports the inventive operations as described herein. Bus 602 is coupled to RAM 603, which may be SRAM, DRAM, or SDRAM. ROM 604 is also coupled to bus 602, which may be PROM, EPROM, or EEPROM. RAM 603 and ROM 604 hold user and system data and programs (e.g., the aforementioned instruction sets) as is well known in the art.

Bus 602 illustrated in FIG. 6 is also coupled to input/output (I/O) controller 605, communications adapter 611, user interface adaptor 608, and display adaptor 609. I/O adapter 605 of the illustrated embodiment connects to storage devices 606, such as one or more of a hard drive, a CD drive, a storage area network (SAN), etc., to the processor-based system. I/O adapter 605 of the illustrated embodiment is also connected to printer 614, which may be utilized to print physical copies of information such as documents, graphics, etc. Note that the printer may be a printer (e.g. dot matrix, laser, etc.), a fax machine, or a copier machine. Communications adaptor 611 is adapted to couple processor-based system 600 to network 612, which may be one or more of a telephone network, a LAN, a WAN, the Internet, etc. User interface adaptor 608 illustrated in FIG. 6 couples user input devices, such as keyboard 613, pointing device 607, and microphone 616, to processor-based system 600. User interface adaptor 608 of the illustrated embodiment also provides sound output to a user via speaker(s) 615. Display adaptor 609 is driven by CPU 601 to control the display on display device 610.

It should be appreciated that the foregoing functional blocks of processor-based system 600 may be utilized as, or in combination with, various of the functional blocks illustrated in FIG. 3A. For example, the functional blocks of processor-based system 600 may be utilized in providing the digital baseband signal processing of digital residual interference cancellation circuit 320 and channel estimation module 316, or portions thereof. Thus, the functional blocks of processor-based system 600 may be provided in combination with analog transmit and receive circuitry (e.g., including transmit chain 211, receive chain 212, multi-tap vector modulator 311, transmit signal sampling module 314, and receive signal sampling module 315) of FIG. 3A, or portions thereof.

It can be appreciated from the foregoing that interference cancellation circuits implementing multi-tap vector modulator interference cancellation according to concepts of the present invention accommodate strong self-interference signals, whereby residual interference can further be eliminated by digital cancellation according to concepts of the present invention. Multi-stage interference cancellation techniques herein resolve problems with respect to large self-interference exceeding the dynamic range of receiver chain components, resolve problems with respect to multi-path self-interference, resolve problems with respect to time varying delay and power level of the interference paths, as well as resolve problems with respect to self-interference signals having nonlinearities associated with active components. Moreover, application of concepts herein provide for nonlinear cancellation and linear cancellation simplified together to a linear type interference cancellation implementation. The interference cancellation provided by embodiments of the present invention facilitate spectrally efficient full duplex communications. Moreover, systems implementing interference cancellation circuits adapted to mitigate full duplex communication self-interference according to the concepts herein allow for greater flexibility in spectrum usage.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A multi-stage self-interference cancellation system, the system comprising:

a transmit signal sampling module coupled to a transmit signal path of a communication station and configured to sample a transmit signal after modification of the transmit signal by a nonlinear component of the transmit signal path, wherein the communication station is operable to transmit and receive using a same frequency simultaneously;

a receive signal sampling module coupled to a receive signal path of the communication station and configured to sample a radio frequency (RF) receive signal as received by the communication station including self-interference from the simultaneous transmitting and receiving using the same frequency;

a channel estimation module coupled to the transmit signal sampling module and the receive signal sampling module and configured to receive a transmit sample signal from the transmit signal sampling module and a receive sample signal from the receive signal sampling module, wherein the transmit sample signal and the receive sample signal undergo analog to digital conversion prior to reception by the channel estimation module, the channel estimation module further configure to determine a baseband channel estimate from the received transmit sample signal and the receive sample signal, and to perform digital to analog conversion of the baseband channel estimate to generate RF channel parameters;

an analog cancellation module coupled to the receive signal path and configured to provide an RF cancellation signal thereto, wherein combining the RF receive signal and the RF cancellation signal provides cancellation of strong self-interference resulting in a residual signal, and wherein the analog cancellation module comprises a multi-tap vector modulation module configured to generate the RF cancellation signal, wherein the RF channel parameters adaptively control the multi-tap vector modulation module to generate the RF cancellation signal to reduce interference in signals received over a time-varying multipath channel; and a digital cancellation module coupled to the receive signal path and configured to provide a residual cancellation signal thereto, wherein combining the residual signal and the residual cancellation signal provides a desired receive signal having the self-interference mitigated.

2. The system of claim 1, wherein the nonlinear component of the transmit signal path comprises a power amplifier.

3. The system of claim 1, wherein the channel estimation module comprises:
   a baseband channel estimation module; and
   a RF channel conversion module, wherein the RF channel conversion module provides the RF channel parameters using a channel estimation provided by the baseband channel estimation module.

4. The system of claim 3, wherein the baseband channel estimation module comprises a channel estimation algorithm module adapted to calculate a RF channel response and a output block adapted to output the RF channel response as multipath in-phase and quadrature coefficients, and wherein the RF channel conversion module comprises a digital to analog converter (DAC) adapted to convert the multipath in-phase and quadrature coefficients to an analog signal and a filter adapted to smooth in-phase and quadrature coefficient changes in the analog signal.

5. The system of claim 4, wherein the channel estimation algorithm module is operable to calculate a correlation between the sampled signals from the transmit signal sampling module and the receive signal sampling module, to interpolate the results of the correlation using a sinc function, and to calculate a plurality of delay relationships.

6. The system of claim 3, wherein the transmit signal sampling module comprises:
   a coupler coupled to an output of the nonlinear component and operable to obtain a sample of the transmit signal;
   a down-converter operable to down convert the sample of the transmit signal;
   a filter operable to reject an unwanted portion of the transmit signal prior to analog to digital conversion thereof; and
   an analog to digital converter (ADC) operable to provide a digital representation of at least a portion of the sampled transmit signal to the channel estimation module.

7. The system of claim 6, wherein the receive signal sampling module comprises:
   a coupler coupled to an output of a receive front-end of the communication station and operable to obtain a sample of the receive signal;
   a down-converter operable to down convert the sample of the receive signal;
   a filter operable to reject an unwanted portion of the receive signal prior to analog to digital conversion thereof; and
   an ADC operable to provide a digital representation of at least a portion of the sampled receive signal to the channel estimation module.

8. The system of claim 1, further comprising:
   a splitter coupled to the transmit signal path and configured to split a sample of the transmit signal into a plurality of transmit signal instances;
   a plurality of delay paths coupled to the splitter and configured to provide different delays with respect to the plurality of transmit signal instances, wherein the multi-tap vector modulation module comprises a plurality of vector modulators coupled to the plurality of delay paths and operable to modulate the delayed transmit signal instances based upon the RF channel parameters;
   a combiner coupled to the plurality of vector modulators and configured to combine the modulated transmit signal instances provided thereby into a modulated cancellation signal;
   a low noise amplifier coupled to the combiner and configured to provide amplification of the modulated cancellation signal; and
   a coupler coupled to the receive signal path and configured to provide the modulated cancellation signal to the receive signal path for combining with the receive signal.

9. The system of claim 1, wherein the digital cancellation module comprises:
   a residual channel estimation module coupled to the transmit signal sampling module and a portion of the receive signal path carrying the residual signal and operable to receive sampled signals therefrom, the residual channel estimation module having circuitry providing residual channel estimation parameters based upon the transmit sample signal from the transmit signal sampling module and the residual signal; and
   a cancellation signal generator module coupled to the residual channel estimation module, wherein the cancellation signal generator module provides the residual cancellation signal using residual channel estimation parameters.

10. The system of claim 9, wherein the cancellation signal generator module comprises a finite impulse response (FIR) module.

11. The system of claim 9, wherein the residual channel estimation module is adapted to provide the residual channel estimation parameters based upon at least one of a correlation channel estimation based on a known transmit signal, a correlation channel estimation based on a known training sequence, a frequency domain channel estimation based on a pilot, or an adaptive filter based on least means squared (LMS) or recursive least squares (RLS).

12. The system of claim 1, further comprising:
   a digital pre-distortion (DPD) module disposed in the transmit signal path and coupled to the receive signal sampling module and configured to receive sampled signals therefrom, wherein the DPD module pre-distorts the transmit signal in the transmit signal path using the sampled signals.

13. A multi-stage self-interference cancellation method, the method comprising:

sampling a transmit signal in a transmit signal path of a communication station after modification of the transmit signal by a nonlinear component of the communication station, wherein the communication station is operable to transmit and receive using a same frequency simultaneously;

sampling a radio frequency (RF) receive signal in a receive signal path of the communication station, wherein the RF receive signal sampled includes self-interference from the simultaneous transmitting and receiving using the same frequency;

performing analog to digital conversion of the sampled transmit signal and the sampled RF receive signal to produce a baseband transmit signal and a baseband receive signal;

determining a baseband channel estimation using the baseband transmit signal and the baseband receive signal;

generating RF channel parameters based upon the determined baseband channel estimation;

generating an analog RF cancellation signal using multi-tap vector modulation, wherein the multi-tap vector modulation is adaptively controlled for time varying channel response using the RF channel parameters;

combining the RF receive signal and the analog RF cancellation signal to provide cancellation of strong self-interference resulting in a residual signal;

determining a residual channel estimate using the sampled transmit signal and a sample of the residual signal;

generating a digital residual cancellation signal using the residual channel estimate; and combining the residual signal and the digital residual cancellation signal to provide a desired receive signal having the self-interference mitigated.

14. The method of claim 13, wherein the nonlinear component of the transmit signal path comprises a power amplifier.

15. The method of claim 13, wherein the determining a channel estimation comprises:

calculating a correlation between the sampled transmit signal and the sampled RF receive signal;

interpolating the results of the correlation using a sinc function; and calculating a plurality of delay relationships for the adaptively controlling the multi-tap vector modulation.

16. The method of claim 13, wherein the generating the analog RF cancellation signal using multi-tap vector modulation comprises:

splitting a sample of the transmit signal into a plurality of transmit signal instances;

for each transmit signal instance of the plurality of transmit signal instances, providing different delays with respect to the transmit signal instances;

for each transmit signal instance of the plurality of transmit signal instances, providing in-phase and quadrature signal components for the transmit signal instances;

for each transmit signal instance of the plurality of transmit signal instances, mixing the in-phase and quadrature components of the transmit signal instance with in-phase and quadrature control inputs of the RF channel parameters; and combining the plurality of transmit signal instances after the mixing to thereby provide a modulated cancellation signal.

17. The method of claim 13, wherein determining the residual channel estimation comprises:

providing residual channel estimation parameters based upon at least one of a correlation channel estimation based on a known transmit signal, a correlation channel estimation based on a known training sequence, a frequency domain channel estimation based on a pilot, or an adaptive filter based on least means squared (LMS) or recursive least squares (RLS).

18. The multi-stage self-interference cancellation system of claim 1, wherein the analog cancellation module is coupled to the receive signal path downstream of the receive signal sampling module such that the combining of the RF cancellation and the RF cancellation signal to produce the residual signal occurs after the sampling by the receive signal sampling module.

* * * * *

UNITED STATES PATENT AND TRADEMARK OFFICE
CERTIFICATE OF CORRECTION

PATENT NO.       : 9,698,836 B2
APPLICATION NO.  : 14/665819
DATED            : July 4, 2017
INVENTOR(S)      : Wen Qin et al.

It is certified that error appears in the above-identified patent and that said Letters Patent is hereby corrected as shown below:

In the Specification

At Column 7, Line number 66, delete "(y=[y$_0$ y$_1$ Y$_{F-1}$]$^r$) is" and replace with -- (y=[y$_0$ y$_1$ ... Y$_{F-1}$]$^r$), M is --.

At Column 11, Line number 6, delete " $\hat{h}_{BB} = \underset{h_{BB}}{\arg\min} \; \|y - Mh_{BB}\|^2$ " and replace with -- $\hat{h}_{BB} = \underset{h_{BB}}{\arg\min} \; \|y - Mh_{BB}\|^2$ --.

Signed and Sealed this
Twenty-second Day of August, 2017

Joseph Matal
*Performing the Functions and Duties of the*
*Under Secretary of Commerce for Intellectual Property and*
*Director of the United States Patent and Trademark Office*